US008164096B2

(12) United States Patent
Choi et al.

(10) Patent No.: US 8,164,096 B2
(45) Date of Patent: Apr. 24, 2012

(54) ORGANIC LIGHT EMITTING DIODE FLAT PANEL DISPLAY DEVICE HAVING UNIFORM ELECTRICAL CHARACTERISTICS AND METHOD OF MANUFACTURING THE SAME

(75) Inventors: Jong-Hyun Choi, Suwon-si (KR); Woo-Sik Jun, Suwon-si (KR)

(73) Assignee: Samsung Mobile Display Co., Ltd., Yongin (KR)

( * ) Notice: Subject to any disclaimer, the term of this patent is extended or adjusted under 35 U.S.C. 154(b) by 619 days.

(21) Appl. No.: 12/047,619

(22) Filed: Mar. 13, 2008

(65) Prior Publication Data

US 2008/0224129 A1 Sep. 18, 2008

(30) Foreign Application Priority Data

Mar. 13, 2007 (KR) ........................ 10-2007-0024584

(51) Int. Cl.
*H01L 27/14* (2006.01)

(52) U.S. Cl. .................... 257/72; 257/40; 257/E51.001; 257/59; 257/294; 438/310; 438/335; 438/143

(58) Field of Classification Search .................... 257/59, 257/294, 72, 40; 438/310, 335, 143
See application file for complete search history.

(56) References Cited

U.S. PATENT DOCUMENTS

| | | | | |
|---|---|---|---|---|
| 2003/0102478 | A1 * | 6/2003 | Joo et al. | 257/72 |
| 2007/0102699 | A1 * | 5/2007 | Lee et al. | 257/40 |

FOREIGN PATENT DOCUMENTS

| | | |
|---|---|---|
| JP | 8-139330 | 5/1996 |
| JP | 2003-8027 | 1/2003 |
| KR | 2001-66251 | 7/2001 |
| KR | 2004-70979 | 8/2004 |
| KR | 2006-1711 | 1/2006 |
| KR | 2006-12850 | 2/2006 |
| KR | 2006-17424 | 2/2006 |
| KR | 10-776481 | 11/2007 |

OTHER PUBLICATIONS

H.K. Chung, K.Y. Lee; Alternative approach to Large size AMOLED HDTV; 2005; SID 05 Digest; 16.1 p. 956-959.*

U.S. Appl. No. 12/048,662, filed Mar. 14, 2008, Kyoung-Bo Kim, Samsung SDI Co., Ltd.

Korean Notice of Allowability issued on Jan. 28, 2008 in the corresponding Korean Patent Application No. 2007-24584.

Notice of Allowance issued in Korean Patent Application No. 2007-26202 on Jul. 29, 2008.

Notice of Allowance issued in Korean Patent Application No. 2007-27141 on Jul. 29, 2008.

* cited by examiner

*Primary Examiner* — Marcos D. Pizarro
*Assistant Examiner* — Eva Yan Montalvo
(74) *Attorney, Agent, or Firm* — H.C. Park & Associates, PLC

(57) ABSTRACT

A flat panel display device, more particularly, an Organic Light Emitting Diode (OLED) display device having uniform electrical characteristics and a method of fabricating the same include: a thin film transistor of which a semiconductor layer including a source, a drain, and a channel region formed in a super grain silicon (SGS) crystallization growth region; a capacitor formed in an SGS crystallization seed region; and an OLED electrically connected to the thin film transistor. Further, a length of the channel region of the silicon layer is parallel with the growth direction in the SGS growth region to improve the electrical properties thereof.

14 Claims, 10 Drawing Sheets

471a 472a 460c 471b 472b 510a 481a 490a 471a' 472a' 460c' 471b' 472b' 510b 481b 490b
520 500 480 470 450 410 400
460a 420e 420c 460b 420d 465 460a' 420e' 420c' 460b' 420d'
a b c

ORGANIC LIGHT EMITTING DIODE FLAT PANEL DISPLAY DEVICE HAVING UNIFORM ELECTRICAL CHARACTERISTICS AND METHOD OF MANUFACTURING THE SAME

CROSS-REFERENCE TO RELATED APPLICATIONS

This application claims the benefit of Korean Patent Application No. 2007-24584, filed Mar. 13, 2007, in the Korean Intellectual Property Office, the disclosure of which is hereby incorporated herein by reference.

BACKGROUND OF THE INVENTION

1. Field of the Invention

Aspects of the present invention relate to a Flat panel display device and a method of manufacturing the same, and more particularly, an OLED display device having uniform electrical characteristics and a method of manufacturing the same.

2. Description of the Related Art

Flat panel display devices such as Liquid Crystal Display (LCD) devices, OLED display devices or Plasma Display Panels (PDPs) have recently attracted attention as such displays overcome disadvantages of conventional display devices, such as Cathode Ray Tubes (CRTs). Here, among the flat panel display devices, OLED display devices and LCD devices include a thin film transistor as a switching or driving device and a capacitor to store an external signal in connection with the thin film transistor and to provide the stored external signal until the next signal period.

FIG. 1A to 1E are cross-sectional views of a conventional OLED display device. First, referring to FIG. 1A, a buffer layer 110 is formed on a substrate 100, which is formed of plastic or glass, and an amorphous silicon layer is formed on the buffer layer 110, and the amorphous silicon layer is patterned to form a semiconductor layer 120 and a first capacitor electrode 125. Subsequently, an insulating layer 130 is formed on the substrate 100, i.e., the insulating layer 130 is formed to cover the patterned semiconductor layer 120, the first capacitor electrode 125, and the buffer layer 110.

Referring to FIG. 1B, a photoresist pattern 140 is formed in a region corresponding to the semiconductor layer 120. An impurity implantation process is performed using the photoresist pattern 140 as a mask, thereby defining source, drain, and channel regions, and implanting impurities into the first capacitor electrode 125.

Referring to FIG. 1C, the insulating layer 130 is etched to form an insulating layer pattern corresponding to the channel region of the semiconductor layer 120, and a metal catalyst layer 150 is formed on the substrate and then removed from regions other than the regions corresponding to the source and drain regions of the semiconductor layer 120 and the first electrode 125.

Referring to FIG. 1D, a gate insulating layer 160 is formed on the substrate 100, and the substrate is annealed to crystallize the source and drain regions and the first capacitor electrode 125 using a metal induced crystallization (MIC) technique and to crystallize the channel region using a metal induced lateral crystallization (MILC) technique.

Referring to FIG. 1E, a gate electrode 170 is formed to correspond to a region of the semiconductor layer 120 (the gate electrode 170 corresponds to the channel region of the semiconductor layer 120), and a second capacitor electrode 175 is formed to correspond to the first capacitor electrode 125. Then, an interlayer insulating layer 180 is formed on the substrate 100, and source and drain electrodes 191 and 192 are formed on the interlayer insulating layer 180 and extend through the interlayer insulating layer 180 and the gate insulating layer 160 to connect to the metal catalyst layer 150 on the source and drain regions of the semiconductor layer 120, thereby completing a thin film transistor and a capacitor. Moreover, not illustrated in FIG. 1E, a first electrode, an organic layer and a second electrode are formed, thereby completing a conventional OLED display device.

However, as described above, when the semiconductor layer is crystallized by the MIC/MILC techniques, MILC crystals are faced in the channel region, thereby generating a MILC front or grain boundary, that is, an uncrystallized region, which results in deterioration of charge mobility and device's characteristics.

SUMMARY OF THE INVENTION

Aspects of the present invention provide a flat panel display device having uniform electrical characteristics and a method manufacturing the same, more particularly, an Organic Light Emitting Diode (OLED) display device having uniform electrical characteristics and a method of manufacturing the same.

According to an aspect of the present invention, a flat panel display device comprising: a thin film transistor disposed on a substrate, the thin film transistor comprising a semiconductor layer formed in a super grain silicon (SGS) crystallization growth region of a crystalline silicon layer disposed on the substrate and having source and drain regions and a channel region, a gate electrode formed to correspond to a partial region of the semiconductor layer, a gate insulating layer to insulate the semiconductor layer from the gate electrode, and source and drain electrode electrically connected to the source and drain regions of the semiconductor layer; a capacitor comprising a first capacitor electrode spaced apart from the thin film transistor on the substrate and formed in an SGS crystallization seed region of the crystalline silicon layer disposed on the substrate, a second capacitor electrode formed on the gate insulating layer, and, the gate insulating layer to insulate the first capacitor electrode from the second capacitor electrode, and a first electrode of a display electrically connected to one of the source or drain electrodes of the thin film transistor.

According to another aspect of the present invention, a method of fabricating a flat panel display device comprising: preparing a substrate; forming an amorphous silicon layer on the substrate; forming first and second capping layers on the amorphous silicon layer; etching the second capping layer to expose a part of the first capping layer; forming a metal catalyst layer to cover the second capping layer and the exposed portion of the first capping layer; annealing the substrate to crystallize the amorphous silicon layer under the exposed first capping layer to form a super grain silicon (SGS) crystallization seed region, and to crystallize the amorphous silicon layer from the SGS crystallization seed region to an SGS crystallization growth region; removing the first capping layer, the second capping layer, and the metal catalyst layer; patterning the crystallized silicon layer to form a first capacitor electrode in the SGS crystallization seed region and to form a semiconductor layer in the SGS crystallization growth region; forming a gate insulating layer to cover the semiconductor layer and the first capacitor electrode; forming a gate electrode on the gate insulating layer in a region corresponding to a partial region of the semiconductor layer; forming a second capacitor electrode on the gate insulating layer in a region corresponding to the first capacitor electrode; forming source and drain electrodes electrically connected to the semiconductor layer; and forming a first electrode of a display to be electrically connected to one of the source or drain electrodes.

According to still another aspect of the present invention, a flat panel display device comprising: a substrate having a first unit pixel region, a second unit pixel region, and an interconnection region disposed therebetween; thin film transistors comprising: semiconductor layers disposed on the first and second unit pixel regions of the substrate, and including source, drain, and channel regions formed in super grain silicon (SGS) crystallization growth regions of a crystalline silicon layer disposed on the substrate, gate electrodes formed to correspond to partial regions of the semiconductor layers, a gate insulating layer to insulate the semiconductor layers from the gate electrodes, and source and drain electrodes electrically connected respectively to the source and drain regions of the semiconductor layer; capacitors comprising: first capacitor electrodes disposed about the interconnection region on the first and second unit pixel regions, and formed in SGS crystallization seed regions of the crystalline silicon layer disposed on the substrate, the gate insulating layer disposed on the first capacitor electrodes, and second capacitor electrodes disposed on the gate insulating layer; and first electrodes of a display electrically connected to one of the source and drain electrodes of the thin film transistors, respectively.

According to yet another aspect of the present invention, a method of fabricating a flat panel display device comprising: preparing a substrate having a first unit pixel region, a second unit pixel region, and an interconnection region disposed therebetween; forming an amorphous silicon layer on the substrate; forming first and second capping layers on the amorphous silicon layer; etching parts of the second capping layer in regions disposed about the interconnection region to expose parts of the first capping layer; forming a metal catalyst layer to cover the second capping layer and the exposed parts of the first capping layer; annealing the substrate to crystallize the amorphous silicon layer under the exposed first capping layer to form super grain silicon (SGS) crystallization seed regions, and to crystallize the amorphous silicon layer from the SGS crystallization seed regions to SGS crystallization growth regions; removing the first capping layer, the second capping layer, and the metal catalyst layer; patterning the crystallized silicon layer to form first capacitor electrodes in the SGS crystallization seed regions and to form semiconductor layers in the SGS crystallization growth regions; forming a gate insulating layer to insulate the semiconductor layers from the gate electrodes; forming gate electrodes on the gate insulating layer in regions corresponding to the semiconductor layers; forming second capacitor electrodes on the gate insulating layer in regions corresponding to the first capacitor electrodes; forming source and drain electrodes electrically connected to the semiconductor layer; and forming first electrodes of a display to be electrically connected respectively with one of the source or drain electrodes.

Additional aspects and/or advantages of the invention will be set forth in part in the description which follows and, in part, will be obvious from the description, or may be learned by practice of the invention.

BRIEF DESCRIPTION OF THE DRAWINGS

These and/or other aspects and advantages of the invention will become apparent and more readily appreciated from the following description of the embodiments, taken in conjunction with the accompanying drawings of which.

DETAILED DESCRIPTION OF THE EMBODIMENTS

Figure 1A:
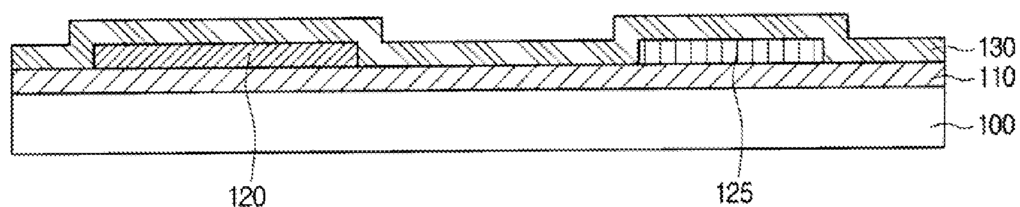
FIGS. 1A to 1E are cross-sectional views of a conventional Organic Light Emitting Diode (OLED) display device.
Figure 1B:
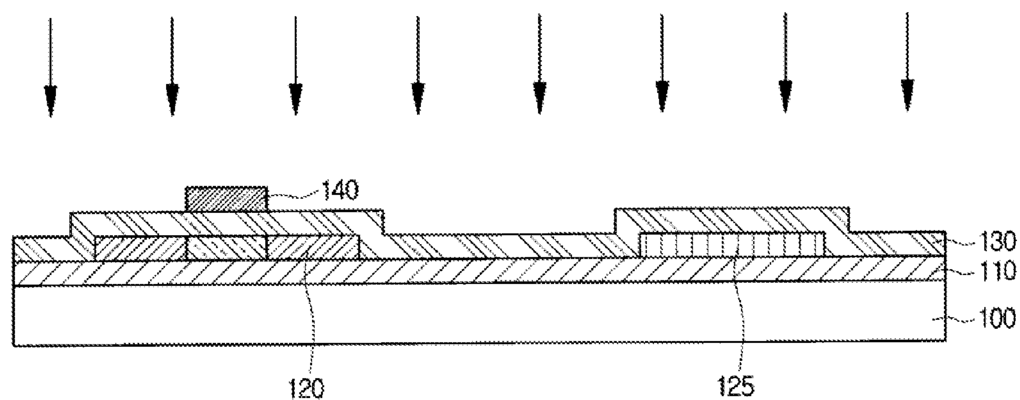
Figure 1C:
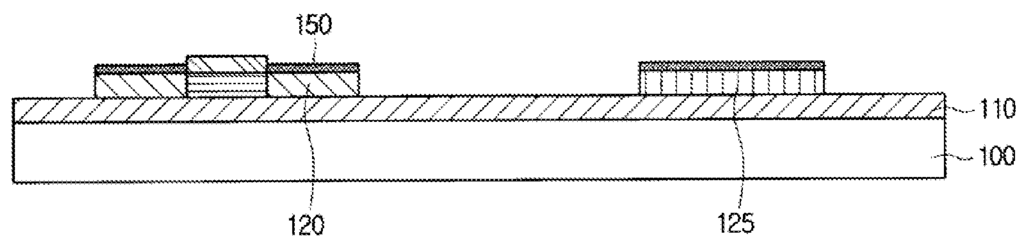
Figure 1D:
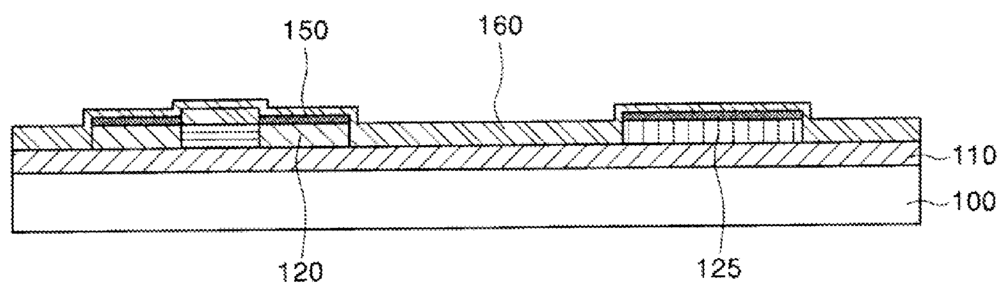
Figure 1E:
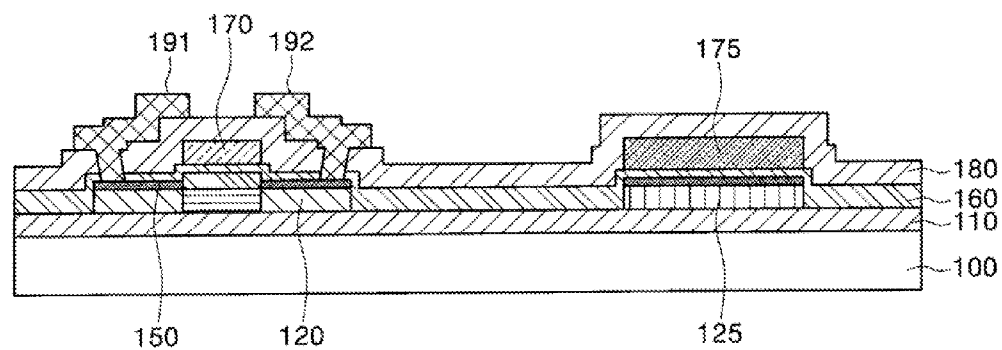

Reference will now be made in detail to the present embodiments of the present invention, examples of which are illustrated in the accompanying drawings, wherein like reference numerals refer to the like elements throughout. The embodiments are described below in order to explain the aspects of the present invention by referring to the figures. It will be understood that when an element or layer is referred to as being "disposed on" or "formed on" another element or layer, it may be directly disposed or formed on the other element or layer, or intervening elements or layers may be present. Other words used to describe the relationship between elements should be interpreted in a like fashion (e.g., "between" versus "directly between", "adjacent" versus "directly adjacent", etc.).

Figure 2A:
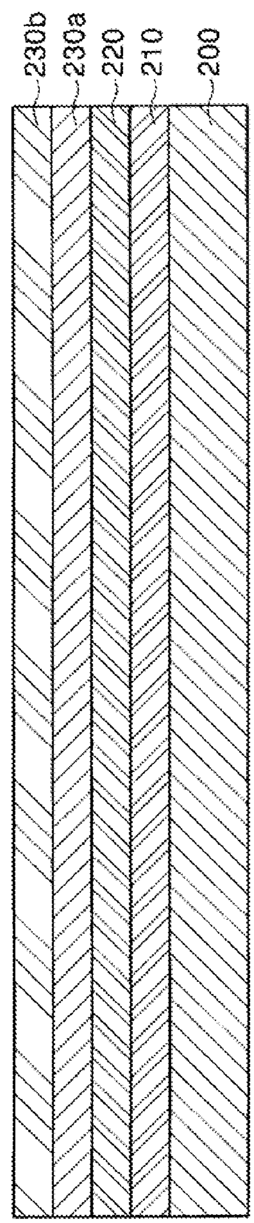
FIGS. 2A, 2B, and 2D to 2H are cross-sectional views
Figure 2B:
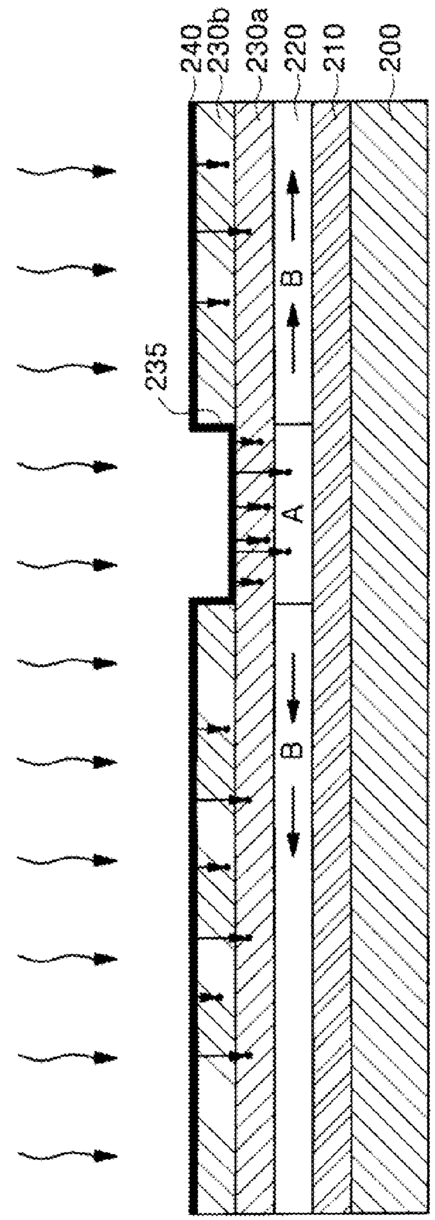
Figure 2C:
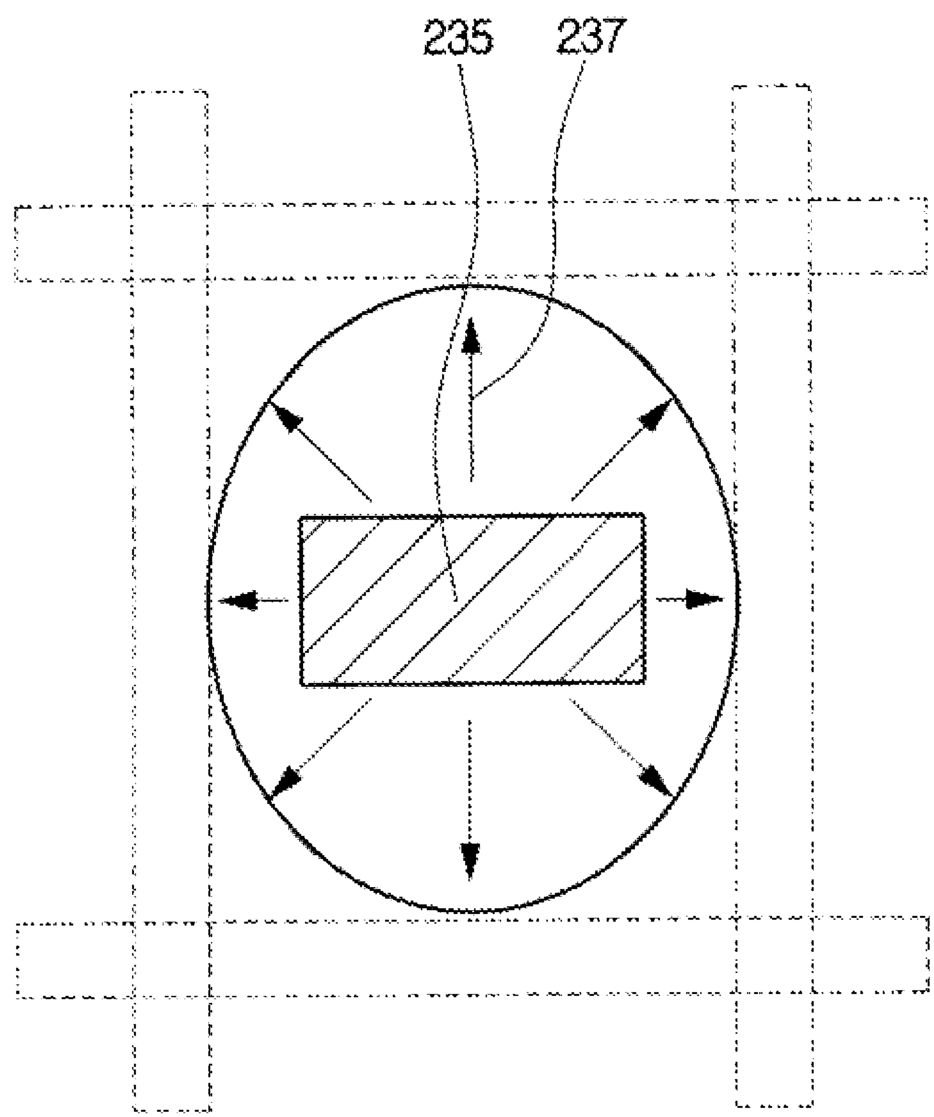
FIG. 2C is a plan view of an OLED display device according to an exemplary embodiment of the present invention.

FIGS. 2A, 2B, and 2D to 2H are cross-sectional views and FIG. 2C is a plan view of an Organic Light Emitting Diode (OLED) display device according to an exemplary embodiment of the present invention. Referring to FIG. 2A, a substrate 200 is provided, which is formed of plastic, conductive material or transparent glass. A buffer layer 210 is formed on the substrate 200. The buffer layer 210 may be formed of a silicon oxide layer, a silicon nitride layer or a double layer thereof and formed by a Chemical Vapor Deposition (CVD) or Physical Vapor Deposition (PVD) technique. Here, the buffer layer 210 prevents diffusion of moisture or impurities generated from the substrate 200 and/or facilitates crystallization of an amorphous silicon layer by controlling a heat transfer rate during crystallization.

An amorphous silicon layer 220 is formed on the entire surface of the substrate 200. The amorphous silicon layer 220 may be formed by a PVD technique, such as sputtering, or a CVD technique, such as Plasma Enhanced CVD (PECVD) or Low Pressure CVD (LPCVD). Also, while or after forming the amorphous silicon layer 220, a hydrogen concentration may be reduced by dehydrogenation.

Then, a first capping layer 230*a* and a second capping layer 230*b* are formed on the entire surface of the substrate 200. The capping layers may be formed of a silicon nitride layer through which a metal catalyst (to be formed in a subsequent process) can be diffused by annealing, or formed of a combination of a silicon nitride layer and a silicon oxide layer. Also, the capping layers may be formed to a thickness of 1 to 2000 Å using a CVD or PVD technique.

Referring to FIG. 2B, a partial region of the second capping region 230*b* corresponding to a region in which the amorphous silicon layer 220 will be formed into a first capacitor electrode is etched, thereby forming an opening 235.

After that, metal catalysts are deposited on the entire surface of the substrate 200, thereby forming a metal catalyst layer 240. Here, the metal catalyst may be one selected from the group consisting of nickel (Ni), palladium (Pd), titanium (Ti), silver (Ag), gold (Au), aluminum (Al), tin (Sn), antimony (Sb), copper (Cu), cobalt (Co), molybdenum (Mo), terbium (Tb), ruthenium (Ru), rhodium (Rh), cadmium (Cd) and platinum (Pt), and preferably Ni. Here, the metal catalyst layer 240 is formed at a surface density of $10^{11}$ to $10^{15}$ atoms/cm$^2$. If the surface density is less than $10^{11}$ atoms/cm$^2$, the amorphous silicon layer may be difficult to crystallize into a polycrystalline silicon layer because of a small amount of seeds that is, cores of crystallization, (i.e., the metal catalysts will not sufficiently seed the crystallization of the silicon layer into a polycrystalline silicon layer). If the surface density is more than $10^{15}$ atoms/cm$^2$, grains of the polycrystalline silicon layer may become smaller because of a large amount of the metal catalysts diffused into the amorphous silicon layer.

Subsequently, the substrate 200 having the buffer layer 210, the amorphous silicon layer 220, the first capping layer 230*a*, the second capping layer 230*b*, and the metal catalyst layer 240 is annealed, thereby moving some of the metal catalysts of the metal catalyst layer 240 to the amorphous silicon layer 220. That is, only a very small amount of the metal catalysts diffused through the first capping layer 230*a* by annealing are diffused into the amorphous silicon layer 220, and most of the metal catalysts cannot reach the amorphous silicon layer 220 or cannot pass through the first and second capping layers 230*a* and 230*b*.

Accordingly, the amount of the metal catalysts reaching the amorphous silicon layer 220 is determined by the diffusion blocking abilities of the first and second capping layers 230*a* and 230*b*, wherein the diffusion blocking ability of the first and second capping layers 230*a* and 230*b* may be related to the thickness of the first and second capping layers 230*a* and 230*b*. That is, as the first and second capping layers 230*a* and 230*b* increase in thickness, the amount of diffused metal catalysts becomes smaller, thereby increasing the size of the grain. However, as the first and second capping layers 230*a* and 230*b* decrease in thickness, the amount of diffused metal catalysts becomes larger, thereby decreasing the size of the grain.

Here, the annealing process is performed in a range from 200 to 900° C. for several seconds to hours in order to diffuse the metal catalysts, which may use one or a combination of a furnace process, a rapid thermal annealing (RTA) process, a UV process, and a laser process.

Accordingly, the metal catalyst diffused into the amorphous silicon layer 220 through the first capping layer 230*a* is combined with silicon of the amorphous silicon layer 220 so as to form metal silicide, and the metal silicide forms a seed, i.e., a core of crystallization, thereby crystallizing the amorphous silicon layer 220 into the polycrystalline silicon layer.

As described above, first and second capping layers 230*a* and 230*b* are formed on the amorphous silicon layer 220, and the metal catalyst layer 240 is formed on the first and second capping layers 230*a* and 230*b* and then annealed to be diffused, thereby crystallizing the amorphous silicon layer 220 into a polycrystalline silicon layer, which is called a Super Grain Silicon (SGS) crystallization technique. That is, region A illustrated in FIG. 2B becomes an SGS crystallization seed region A having metal silicide seeds formed by combining the metal catalyst diffused into the amorphous silicon layer 220 through the first capping layer 230*a* with the silicon. Region B becomes an SGS crystallization growth region B in which the metal catalyst seeds rarely exist because the metal catalyst cannot diffuse through the first and second capping layers 230*a* and 230*b* into the amorphous silicon layer 220, and crystals are grown from the SGS crystallization seed region A into the polycrystalline silicon layer into the SGS crystallization growth region B.

To be more specific, referring to FIG. 2C, a unit pixel region is illustrated. In an opening 235 of the unit pixel, the SGS crystallization seed region A (as in FIG. 2B), is formed, and the SGS crystallization growth region B (as in FIG. 2B) is a peripheral region of the SGS crystallization seed region A. Polycrystalline silicon is crystallized from the SGS crystallization seed region A to the SGS crystallization growth region B so as to crystallize the amorphous silicon layer 220 into the polycrystalline silicon. As a result, at an edge of the unit pixel in which a metal interconnection will be formed, SGS crystallization crystals of different unit pixels are faced, thereby generating a grain boundary. Thus, a uniform polycrystalline silicon layer without a grain boundary is formed in each pixel unit, which advantageously forms a semiconductor layer having no grain boundary in any unit pixel except the SGS crystallization seed region.

Figure 2D:
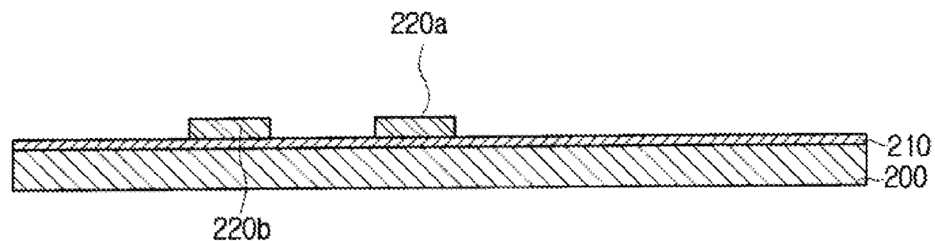

Referring to FIG. 2D, after removing the first capping layer 230*a*, the second capping layer 230*b*, and the metal catalyst layer 240, the crystallized polycrystalline silicon layer is patterned to form a semiconductor layer 220*a* and a first capacitor electrode 220*b*. Here, the first capacitor electrode 220*b* is formed in the SGS crystallization seed region A formed in the previous crystallization process. The capacitor has better characteristics as the capacitor electrode is closer to metal. The SGS crystallization seed region A includes the metal silicide, so it is preferable the first capacitor electrode 220*b* is formed by using the SGS crystallization seed region but is not limited thereto. Also, the semiconductor layer 220*a* is formed in the SGS crystallization growth region B formed in the previous crystallization process. It may be preferable that a length direction of a channel region of the semiconductor layer 220*a* is formed parallel to the SGS crystallization growth direction. That is, since the length direction of the channel region of the semiconductor layer 220*a* is parallel to the SGS crystallization direction 237 of FIG. 2C, the channel region may be formed without a grain boundary, which results in improvement of electrical characteristics of the device without deterioration of charge mobility.

Figure 2E:
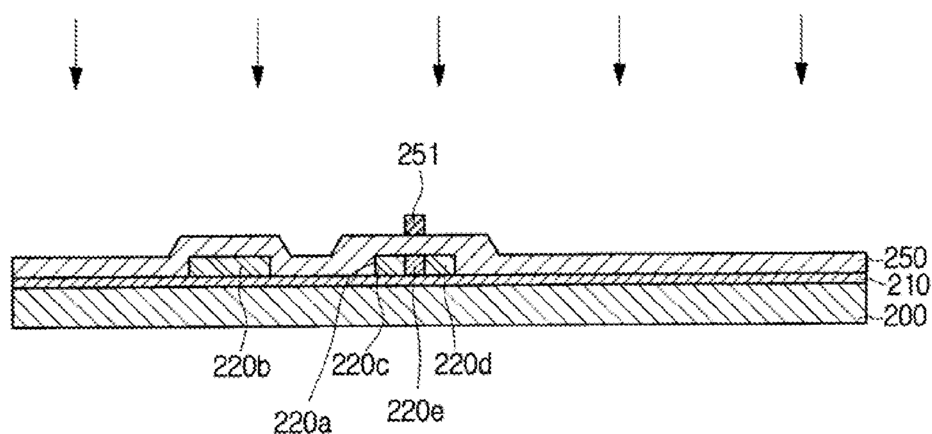

Then, referring to FIG. 2E, a gate insulating layer 250 is formed on the entire surface of the substrate 200, i.e., the gate insulating layer 250 is formed on the substrate 200 to cover the semiconductor layer 220*a*, the first capacitor electrode 220*b*, and the buffer layer 210. The gate insulating layer 250 may be formed of a silicon oxide layer, a silicon nitride layer, or a combination thereof. The gate insulating layer 250 is disposed between the semiconductor layer 220*a* and a gate electrode to be formed layer, thereby the gate insulating layer 250 insulates the semiconductor layer 220*a* from the gate electrode. Also, the gate insulating layer 250 may disposed between the first capacitor electrode 220*b* and a second capacitor electrode to be formed later, thereby controlling the capacitance of a capacitor according to the thickness of the gate insulating layer 250. Since capacitance is inversely proportional to the thickness of an insulating layer of a capacitor, the gate insulating layer 250 is preferably formed thinly.

After that, a photoresist is coated on the substrate 200 by, for example, spin coating, and exposed and developed to form a photoresist pattern 251 on a partial region corresponding to the semiconductor layer 220*a*. It may be preferable that the photoresist pattern 251 is formed on a region corresponding to the middle of the semiconductor layer 220*a* because the region corresponding to the photoresist pattern 251 will be defined as a channel region of the semiconductor layer 220*a* later.

Subsequently, impurities are implanted into the entire surface of the substrate 200 having the photoresist pattern 251 using the photoresist pattern 251 as a mask. Thereby, source and drain regions 220_c_ and 220_d_ and a channel region 220_e_ are defined in the semiconductor layer 220_a_. Here, the source and drain regions 220_c_ and 220_d_ are implanted with impurities, but the channel 220_e_ is not implanted with impurities due to the photoresist pattern 251.

The first capacitor electrode 220_b_ is also implanted with impurities to obtain characteristics close to a conductor by implanting impurities into the polycrystalline silicon, i.e., semiconductor, because a capacitor has better characteristics as the capacitor electrode is closer to a conductor.

Figure 2F:
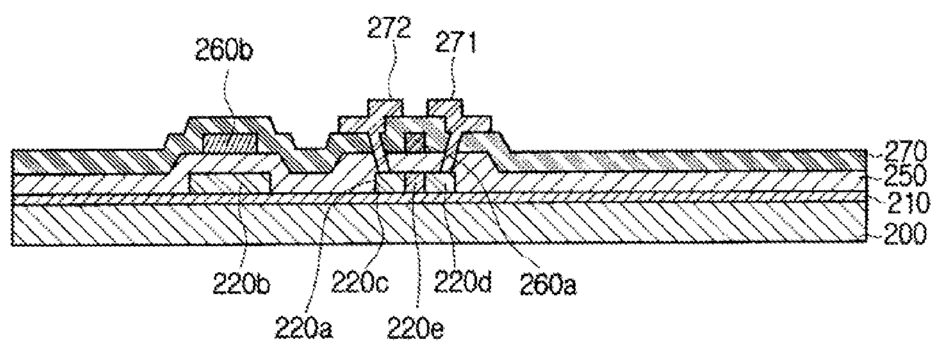

Referring to FIG. 2F, after the impurity implantation process, the photoresist pattern 251 is removed, and a conductive material simultaneously forming a gate electrode and a second capacitor electrode is deposited on the entire surface of the substrate 200. Then, the conductive material is patterned to correspond to a partial region of the semiconductor layer 220_a_ and the first capacitor electrode 220_b_, thereby forming the gate electrode 260_a_ and the second capacitor electrode 260_b_, and thus a capacitor is completed. Here, the second capacitor electrode 260_b_ may be formed of the same material as the gate electrode 260_a_ or source and drain electrodes 271 and 272.

After that, an interlayer insulating layer 270 is formed on the entire surface of the substrate 200, the interlayer insulating layer 270 and the gate insulating layer 250 are partially etched to expose surfaces of the source and drain regions 220_c_ and 220_d_ of the semiconductor layer 220_a_, and then source and drain electrode materials are deposited and patterned to form source and drain electrodes 271 and 272. Thus, a thin film transistor is completed.

As such, by using the SGS crystallization technique, no grain boundary is formed in the channel region of the semiconductor layer, thereby improving charge mobility and electrical characteristics of the thin film transistor. The thin film transistor according to the exemplary embodiment of the present invention is not limited to an Organic Light Emitting Diode (OLED) display device to be described later, and may be employed in other display devices, such as Liquid Crystal Display (LCD) devices.

Figure 2G:
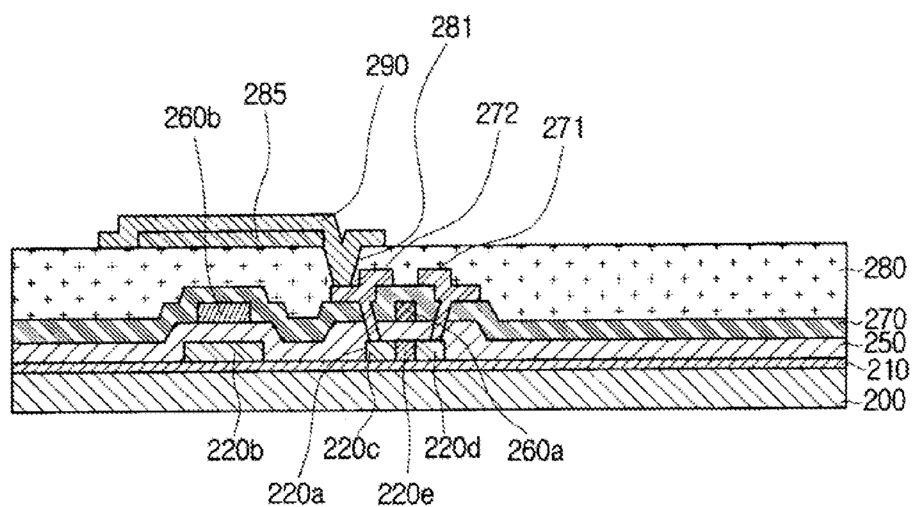

Then, referring to FIG. 2G, a planarization layer 280 is formed on the entire surface of the substrate 200. The planarization layer 280 may be formed of an organic layer, an inorganic layer, or a combination thereof. If the planarization layer 280 is an inorganic layer, Spin On Glass (SOG) may be used, whereas if the planarization layer 280 is an organic layer, acryl series resin, polyimide series resin, or benzocyclobutene (BCB) may be used. Also, the planarization layer 280 includes a hole 281 exposing one of the source and drain electrodes 271 and 272.

A first electrode 290 is formed on the planarization layer 280. The first electrode 290 may include a reflective layer 285 formed on the planarization layer 280. The first electrode 290 is in contact with one of the exposed source and drain electrodes 271 and 272 through the hole 281, and extends onto the planarization layer 280. The first electrode 290 may be formed of indium tin oxide (ITO) or indium zinc oxide (IZO).

Figure 2H:
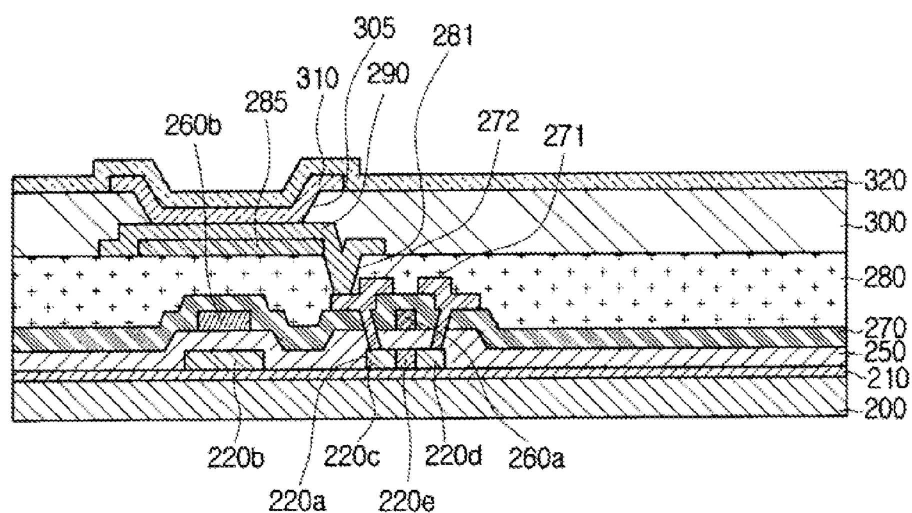

Referring to FIG. 2H, a pixel defining layer 300 is formed on the entire surface of the substrate 200 including the first electrode 290, and formed to have a sufficient thickness to cover the first electrode 290. The pixel defining layer 300 may be an organic layer or an inorganic layer, and preferably an organic layer. More preferably, the pixel defining layer 300 is formed of one selected from the group consisting of BCB, an acryl series polymer, and polyimide. The pixel defining layer 300 may be evenly formed on the entire surface of the substrate 200 because of its excellent flowability. The pixel defining layer 300 is etched to form an opening 305 to expose the first electrode 290.

Then, an organic layer 310 is formed on the first electrode 290 exposed through the opening 305. The organic layer 310 includes at least an emission layer, and may further include at least one of a hole injection layer, a hole transport layer, an electron transport layer, and an electron injection layer. The organic layer 310 may include red (R), green (G), and/or blue (B) emission layers to display full colors. The organic layer 310 may be formed of an organic material displaying white, or may be formed of emission layers realizing white by stacking R, G and B emission layers.

Finally, a second electrode 320 is formed on the entire surface of the substrate 200. The second electrode 320 may be formed as a transmissive electrode. The second electrode 320 may be formed of magnesium (Mg), Ag, Al, calcium (Ca), and alloys thereof having a low work function. Thus, an OLED display device is completed. As such, by using the SGS crystallization technique, a grain boundary does not exist in the channel region of the semiconductor layer, and thus an OLED display device having improved charge mobility and electrical characteristics can be provided. Further, a grain boundary does not exist in a pixel region, thereby improving electrical characteristics thereof.

Figure 3:
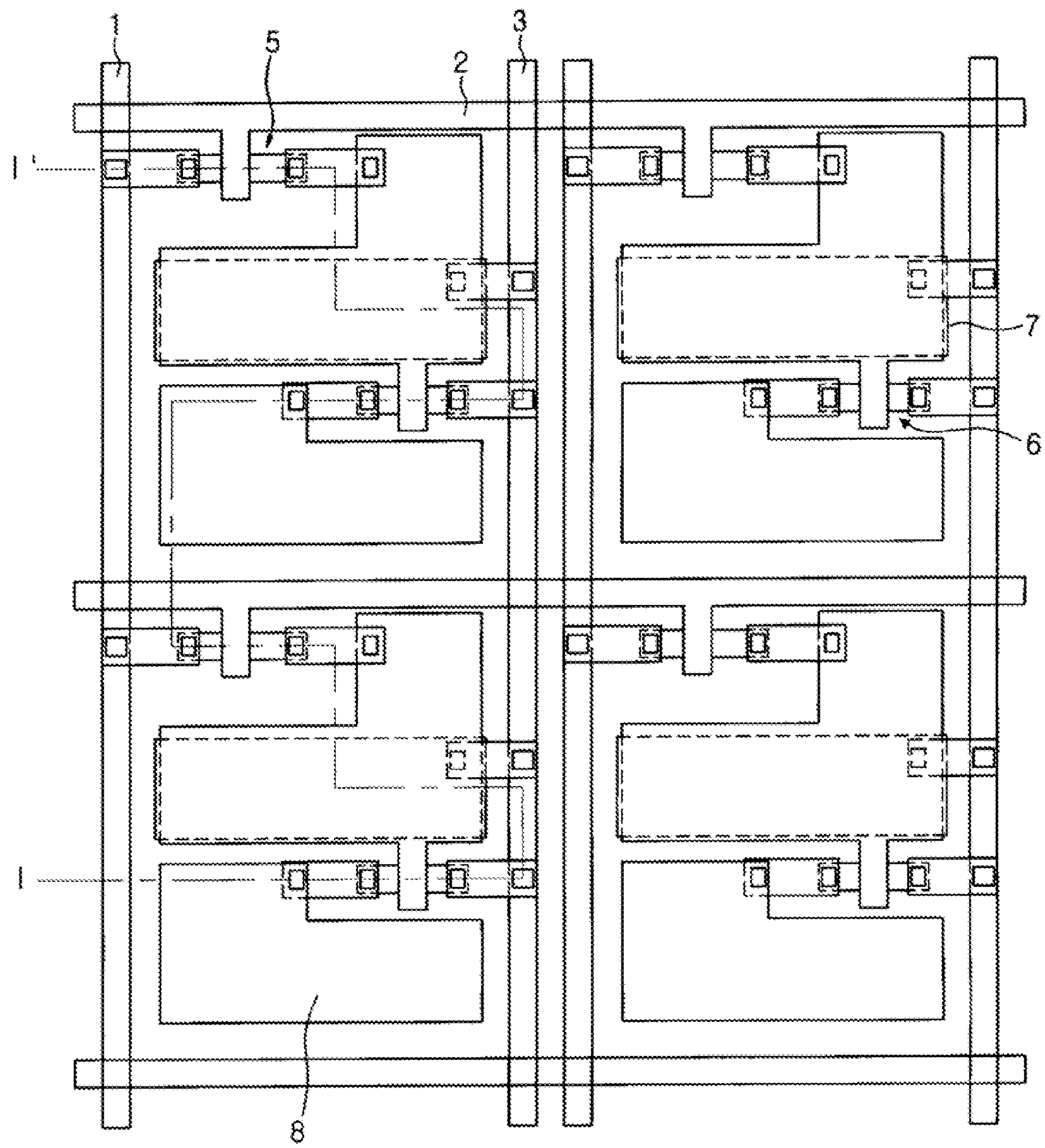
FIG. 3 is a plan view of an OLED display device according to an exemplary embodiment of the present invention.

FIG. 3 is a plan view of an OLED display device according to an exemplary embodiment of the present invention. Referring to FIG. 3, a data line 1 is arranged in one direction, a scan line 2 is insulated from the data line 1, and the data line 1 and the scan line 2 cross each other. A common power voltage line 3 is insulated from the scan line 2 and disposed parallel to the data line 1, and the common power voltage line 3 crosses the scan line 2. A plurality of unit pixels, for example, R, G, and B unit pixels, are defined by the data line 1, the scan line 2, and the common power voltage line 3.

Accordingly, in each unit pixel, data signals applied to the data line 1 in response to a signal applied to the scan line 2 are input to a driving thin film transistor 6. A capacitor 7 accumulates charges according to a difference between a data voltage and a voltage applied to the common power line 3, and signals by the charges accumulated in the capacitor 7 are input to the driving thin film transistor 6 through a switching thin film transistor 5.

Then, the driving thin film transistor 6 receiving the data signal emits light by sending an electrical signal to an OLED 8 having a pixel electrode, i.e., a first electrode, an upper electrode, i.e., a second electrode, and an organic emission layer which is formed between both the electrodes.

Figure 4A:
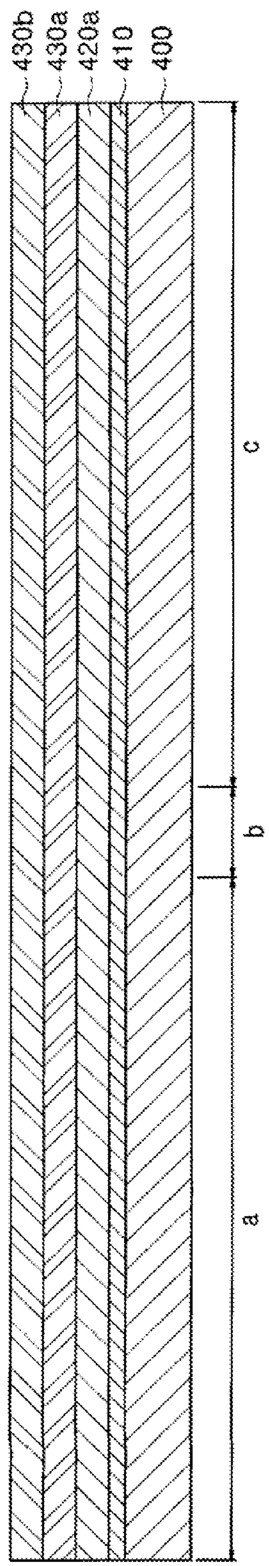
FIGS. 4A to 4F are cross-sectional views of the OLED display device taken along line I-I' of FIG. 3.

FIGS. 4A to 4F are cross-sectional views of the OLED display device taken along line I-I' of FIG. 3. Referring to FIG. 4A, a substrate 400 is formed of plastic, conductive material, or transparent glass. In the substrate 400, a first unit pixel region a, an interconnection region b, and a second unit pixel region c are defined. The interconnection region b is a region in which a metal interconnection is formed. The interconnection region b may be disposed in edges of respective unit pixels.

A buffer layer 410 is formed on the substrate 400. The buffer layer 410 may be formed in a single or double layer using a silicon oxide layer and/or a silicon nitride layer, and the buffer layer 410 may be formed by a CVD or PVD technique. Here, the buffer layer 410 serves to prevent diffusion of moisture or impurities generated from the substrate 400 and to facilitate crystallization of an amorphous silicon layer by controlling a heat transmission rate during crystallization.

Subsequently, an amorphous silicon layer 420*a* is formed on the entire surface of the substrate 400. The amorphous silicon layer 420*a* may be formed using a PVD technique, such as sputtering, or a CVD technique, such as PECVD or LPCVD. Also, while or after forming the amorphous silicon layer 420*a*, a hydrogen concentration may be lowered by dehydrogenation.

Then, a first capping layer 430*a* and a second capping layer 430*b* are formed on the entire surface of the substrate 400. The first and second capping layers 430*a* and 430*b* may be a silicon nitride layer into which metal catalysts formed in the subsequent process are diffused by annealing, or a combination of a silicon nitride layer and a silicon oxide layer. Also, the first and second capping layers 430*a* and 430*b* may be formed using a CVD or PVD technique, wherein the capping layer may be formed to a thickness of 1 to 2000 Å.

Figure 4B:
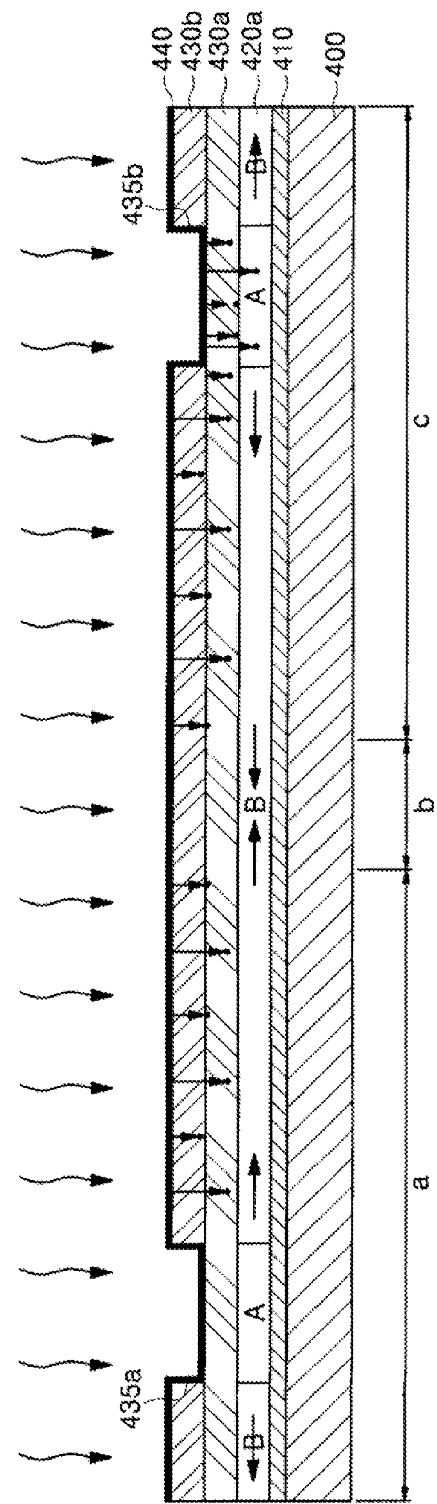

Referring to FIG. 4B, a partial region of the second capping layer 430*b*, that is, a partial region of the second capping layer 430*b* on a region in which the amorphous silicon layer 420*a* will be formed into a first capacitor electrode, is etched to form openings 435*a* and 435*b*. Here, the openings 435*a* and 435*b* expose a partial region of the first capping layer 430*a* by etching the second capping layer 430*b* in regions symmetrically disposed about the interconnection region b. The grain boundary as described above is formed in the interconnection region b in the subsequent SGS crystallization process.

A metal catalyst layer 440 is formed by depositing a metal catalyst on the entire surface of the substrate 400. Here, the metal catalyst may be one selected from the group consisting of Ni, Pd, Ti, Ag, Au, Al, Sn, Sb, Cu, Co, Mo, Tb, Ru, Rh, Cd and Pt, and preferably Ni. Here, the metal catalyst layer 440 is formed at a surface density of $10^{11}$ to $10^{15}$ atoms/cm$^2$. While, if the surface density is less than $10^{11}$ atoms/cm$^2$, the amorphous silicon layer may be difficult to crystallize into a polycrystalline silicon layer due to a low amount of seeds, that is, crystallization cores; and if the surface density is more than $10^{15}$ atoms/cm$^2$, a crystal grain of the polycrystalline silicon layer may become smaller due to a large amount of the metal catalysts diffused into the amorphous silicon layer.

Subsequently, the substrate 400 having the buffer layer 410, the amorphous silicon layer 420*a*, the first capping layer 430*a*, the second capping layer 430*b*, and the metal catalyst layer 440 is annealed. During annealing, some of the metal catalysts in the metal catalyst layer 440 move to the amorphous silicon layer 420*a*. That is, only a very small amount of the metal catalysts diffuse into the amorphous silicon layer 420*a* through the first capping layer 430*a* by annealing, and most of the metal catalysts cannot reach the amorphous silicon layer 420*a* or cannot pass through the first and second capping layers 430*a* and 430*b*.

Thus, the amount of the metal catalysts reaching the amorphous silicon layer 420*a* is determined by diffusion blocking abilities of the first and second capping layers 430*a* and 430*b*, wherein the diffusion blocking ability of the first and second capping layers 430*a* and 430*b* may be related to the thickness of the first and second capping layers 430*a* and 430*b*. That is, as the thickness of the first and second capping layers 430*a* and 430*b* increases, the diffusion amount decreases, thereby the grain becomes larger, and as the thickness of the first and second capping layers 430*a* and 430*b* decreases, the diffusion amount increases, thereby the grain becomes smaller.

Here, the annealing process is performed at a temperature of 200 to 900° C. for several seconds to hours in order to diffuse the metal catalysts by one or a combination of a furnace process, an RTA process, an UV process, and a laser process.

Accordingly, the metal catalysts diffused into the amorphous silicon layer 420*a* through the first capping layer 430*a* are combined with silicon of the amorphous silicon layer to form metal silicide, and the metal silicide forms a seed, i.e., a core of crystallization, thereby crystallizing the amorphous silicon layer into the polycrystalline silicon layer. As such, the first and second capping layers 430*a* and 430*b* are formed on the amorphous silicon layer, and the metal catalyst layer is formed on the first and second capping layers 430*a* and 430*b* and annealed to diffuse the metal catalysts therethrough, thereby crystallizing the amorphous silicon layer into the polycrystalline layer, which is called an SGS crystallization technique.

That is, region A illustrated in FIG. 4B becomes an SGS crystallization seed region A having a seed formed of the metal silicide by combining the metal catalysts diffused into the amorphous silicon layer 420*a* through the first capping layer 430*a* with the silicon, and region B becomes an SGS crystallization growth region B, which does not include the seed because the metal catalysts cannot diffuse into the amorphous silicon layer 420*a* due to the first and second capping layers 430*a* and 430*b*. The SGS crystallization growth region B is crystallized into the polycrystalline silicon layer by growing crystals from the SGS crystallization seed region A.

More specifically, region A, i.e., the SGS crystallization seed region A, is formed through the openings 435*a* and 435*b* of the first and second unit pixel regions a and b, and region B, i.e., a peripheral region of the SGS crystallization seed region, becomes the SGS crystallization growth region B by growing the crystals from the SGS crystallization seed region A to be crystallized into the polycrystalline silicon layer. Thus, SGS crystals of the first and second unit pixel regions are faced in the interconnection region b in which a metal interconnection will be formed, thereby creating a grain boundary. As a result, since the grain boundary is formed in the interconnection region b, the uniform polycrystalline silicon layer, which does not have a grain boundary, is formed in each unit pixel, and thus a semiconductor layer which does not have a grain boundary in any unit pixel may be formed.

In this embodiment according to aspects of the present invention, the SGS crystallization seed region A, that is, a region in which a first capacitor electrode will be formed, is located in the middle of each unit pixel and then crystallized. Further, when the SGS crystallization seed region A, in which the first capacitor electrode will be formed, is symmetrically disposed about the interconnection region b, the grain boundary may be formed in the interconnection region b.

Figure 4C:
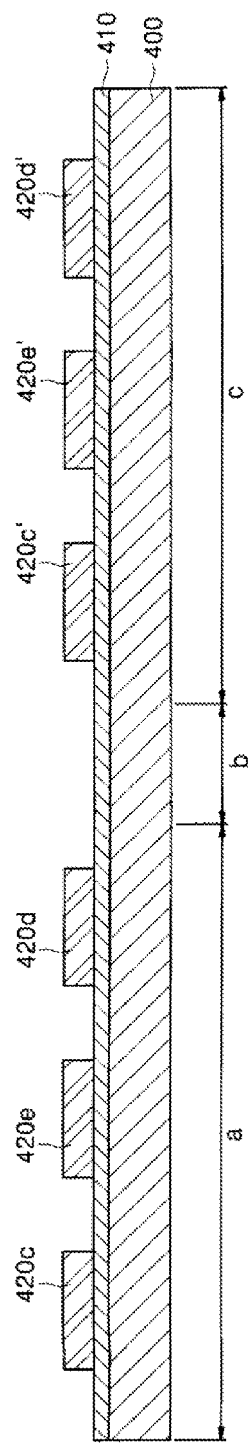

Then, referring to FIG. 4C, the crystallized polycrystalline silicon layer is patterned, and semiconductor layers 420*c* and 420*d* and a first capacitor electrode 420*e* are formed in the first unit pixel region a, and semiconductor layers 420*c*' and 420*d*' and first capacitor electrode 420*e*' are formed in the second unit pixel region c.

The first capacitor electrodes 420*e* and 420*e*' preferably use the SGS crystallization seed region formed in the previous crystallization process, in which metal silicide exists, because the characteristics of the first capacitor electrodes 420*e* and 420*e*' become better as the first capacitor electrodes 420*e* and 420*e*' are closer to metal.

Also, the semiconductor layers 420*c*, 420*d*, 420*c*', and 420*d*', use the SGS crystallization growth region B formed in the previous crystallization process, and may be formed to have a length direction of a channel region of the semiconductor layer (i.e., the channel region of the patterned, polycrystallized amorphous silicon layer 420) parallel to the SGS crystallization growth direction. That is, since the length directions of the channel regions of the semiconductor layers

420*c*, 420*d*, 420*c*', and 420*d*' are formed parallel to the SGS crystallization growth direction, the channel regions without grain boundaries may be formed, thereby improving electrical characteristics of the device without deterioration of charge mobility.

Figure 4D:
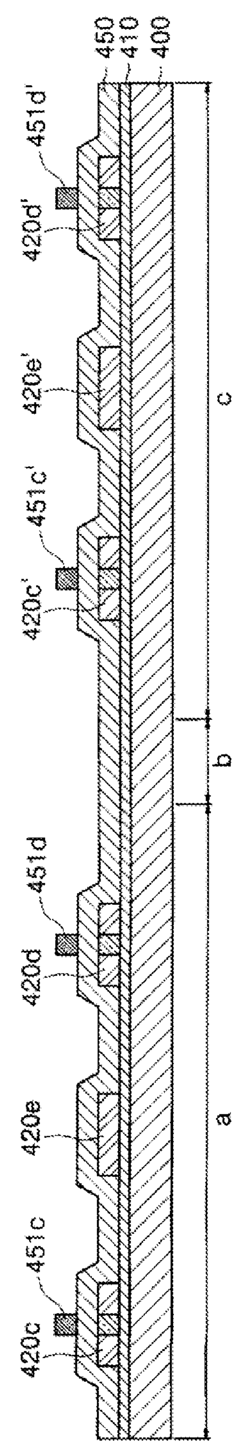

After that, referring to FIG. 4D, a gate insulating layer 450 is formed on the entire surface of the substrate 400. The gate insulating layer 450 may be formed of a silicon oxide layer, a silicon nitride layer, or a combination thereof. The gate insulating layer 450 is disposed between the semiconductor layers 420*c*, 420*d*, 420*c*', 420*d*' and gate electrodes to be formed layer; therefore, the gate insulating layer 450 insulate the semiconductor layers 420*c*, 420*d*, 420*c*', 420*d*' from the gate electrodes. Also, The gate insulating layer 450 may be disposed between the first capacitor electrode 420*e* and 420*e*' and a second capacitor electrode to be formed later, thereby controlling the thickness of the gate insulating layer 450 to control capacitance of a capacitor. Here, the capacitance is inversely proportional to the thickness of the insulating layer of the capacitor, and thus the gate insulating layer 450 may be formed thinly.

Then, a photoresist is coated on the substrate 400 by, for example, spin coating, and exposed and developed, thereby forming photoresist patterns 451*c*, 451*c*, 451*c*' and 451*c*' on partial regions corresponding to the semiconductor layers 420*c*, 420*d*, 420*c*', and 420*d*', respectively. It may be preferable that the photoresist patterns are formed on regions corresponding to the middle of the semiconductor layers 420*c*, 420*d*, 420*c*', and 420*d*', respectively, because the regions corresponding to the photoresist patterns 451*c*, 451*c*, 451*c*', and 451*d*' will be defined as channel regions of the semiconductor layers 420*c*, 420*d*, 420*c*', and 420*d*' later.

Subsequently, an impurity implantation process is performed on the entire surface of the substrate 400 having the photoresist patterns 451*c*, 451*c*, 451*c*', and 451*c*' as masks. As a result, source, drain, and channel regions are defined in the semiconductor layers 420*c*, 420*d*, 420*c*', and 420*d*'. Here, in each semiconductor layer 420*c*, 420*d*, 420*c*', or 420*d*', the regions implanted with impurities are defined as the source and drain regions, and the regions not implanted with impurities protected by the photoresist pattern are defined as the channel regions. The first capacitor electrodes 420*e* and 420*e*' are also implanted with impurities to provide conductibility thereto because the capacitor has better characteristics as the capacitor electrode is closer to a conductor.

Figure 4E:
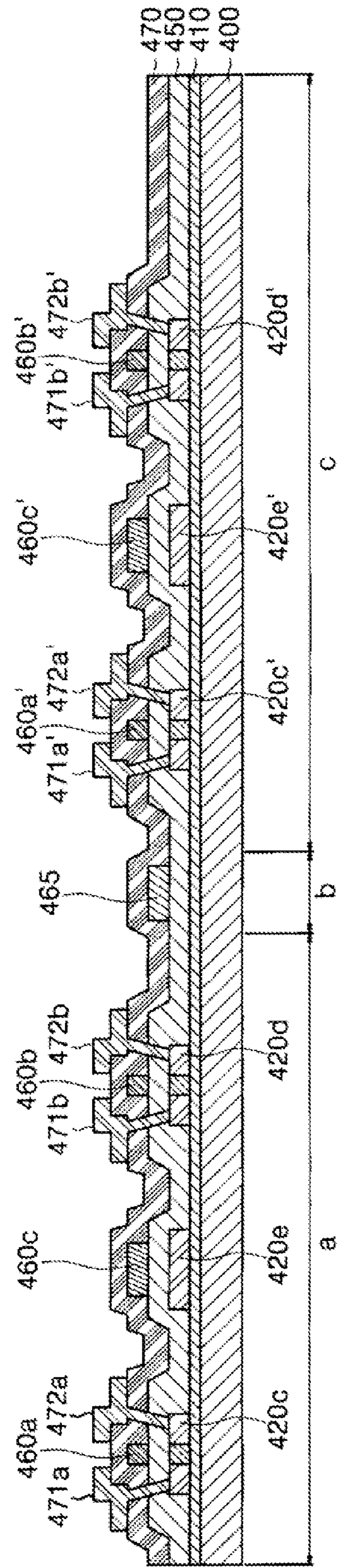

Referring to FIG. 4E, after the impurity implantation process, the photoresist patterns 451*c*, 451*c*, 451*c*', and 451*c*' are removed, and a conductive material which simultaneously forms a gate electrode and a second capacitor electrode is deposited on the entire surface of the substrate 400. Then, the conductive material is patterned to correspond to partial regions of the semiconductor layers 420*c*, 420*d*, 420*c*', and 420*d*' and the first capacitor electrode to form gate electrodes 460*a*, 460*b*, 460*a*', and 460*b*', and second capacitor electrodes 460*c* and 460*c*', and thus the capacitor is completed. Here, the second capacitor electrodes 460*c* and 460*c*' may be formed of the same material as the gate electrode or the source and drain electrodes. Further, a metal interconnection 465 may be formed in the interconnection region b on the gate insulating layer 450 to be covered by the interlayer insulating layer 470.

Then, after the interlayer insulating layer 470 is formed on the entire surface of the substrate 400, and partial regions of the interlayer insulating layer 470 and the gate insulating layer 450 are etched, thereby exposing surfaces of the source and drain regions of the semiconductor layers 420*c*, 420*d*, 420*c*', and 420*d*', and source and drain electrode materials are deposited and then patterned, thereby forming source and drain electrodes 471*a*, 472*a*, 471*b*, 472*b*, 471*a*', 472*a*', 471*b*', and 472*b*'. Finally, the thin film transistors and the capacitors are completed.

As such, the channel region of the semiconductor layer does not have a grain boundary due to the SGS crystallization technique, which results in improvement of the charge mobility and electrical characteristics of the thin film transistor. The thin film transistor according to the exemplary embodiments of the present invention is not limited to an OLED display device to be described later, and may be applied to other display devices, such as LCD devices.

Figure 4F:
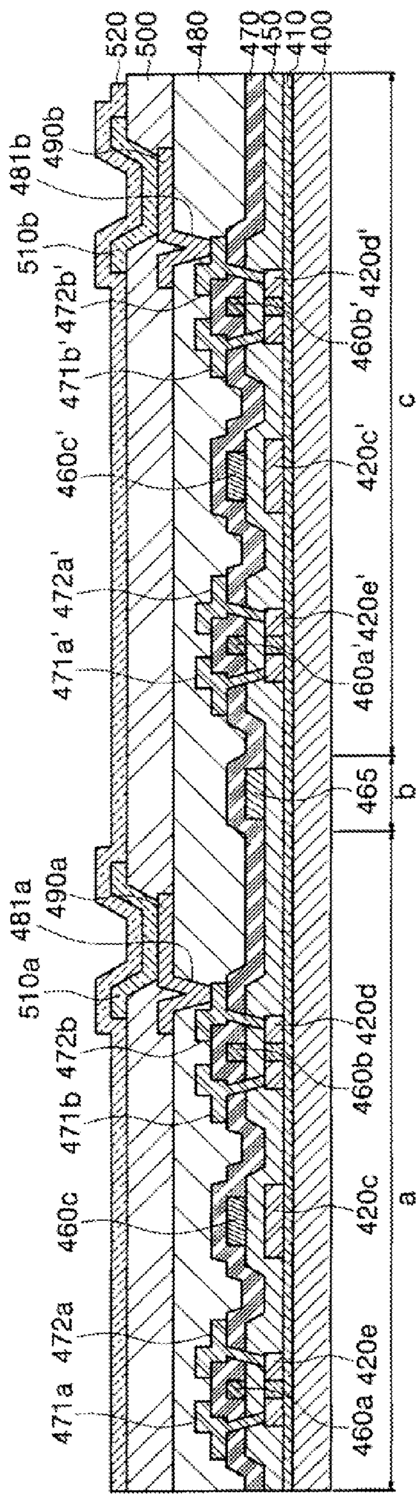

Then, referring to FIG. 4F, a planarization layer 480 is formed on the entire surface of the substrate 400. The planarization layer 480 may be an organic layer, an inorganic layer, or a combination thereof. When the planarization layer 480 is an inorganic layer, Spin On Glass (SOG) may be used, when the planarization layer 480 is an organic layer, acryl series resin, polyimide series resin, or BCB may be used. Also, the planarization layer 480 includes holes 481*a* and 481*b* each exposing one of the source and drain electrodes 471*a*, 472*a*, 471*b*, 472*b*, 471*a*', 472*a*', 471*b*', and 472*b*'.

First electrodes 490*a* and 490*b* are formed on the planarization layer 480. The first electrodes 490*a* and 490*b* are in contact with the exposed source and drain electrodes (472*b* and 472*b*' in FIG. 4F) through the holes 481*a* and 481*b*, respectively, and extend onto the planarization layer 480. The first electrodes 490*a* and 490*b* may be formed of ITO or IZO.

Then, a pixel defining layer 500 is formed on the entire surface of the substrate 400 including the first electrodes 490*a* and 490*b*, which is formed to have a sufficient thickness cover the first electrodes 490*a* and 490*b*. The pixel defining layer 500 may be an organic or inorganic layer, and preferably an organic layer. More preferably, the pixel defining layer 500 may be formed of one selected from the group consisting of BCB, acryl series polymer, and polyimide. The pixel defining layer 500 has excellent flowability, and thus may be evenly formed on the entire surface of the substrate 400. The pixel defining layer 500 is etched to form openings exposing the first electrodes 490*a* and 490*b*.

Subsequently, organic layers 510*a* and 510*b* are formed on the first electrodes 490*a* and 490*b* exposed through the openings. The organic layers 510*a* and 510*b* include at least an emission layer, and further include at least one of a hole injection layer, a hole transport layer, an electron transport layer, and an electron injection layer. The organic layers 510*a* and 510*b* may include R, G and B emission layers to realize full colors. The organic layers 510*a* and 510*b* may be formed of an organic material displaying white, or may be emission layers realizing white by stacking R, G and B emission layers.

Then, a second electrode 520 is formed on the entire surface of the substrate 400. The second electrode 520 may be formed as a transmissive electrode and may be formed of a low work function material such as Mg, Ag, Al, Ca, or alloys thereof. Thus, the OLED display device according to aspects of the present invention is completed.

As such, by using the SGS crystallization technique, a grain boundary does not exist in the channel region of the semiconductor layer, which may result in improved charge mobility and electrical characteristics. Also, the SGS crystallization seed regions are symmetrically disposed about the interconnection region, thereby the grain boundary does not exist in each unit pixel region, and thus the semiconductor layer may be formed in any region without limitation. Consequently, an OLED display device and a method of fabricating the same according to aspects of the present invention can uniformly control electrical characteristics of a thin film transistor, and enhance luminous efficiency of the OLED display device.

Although a few embodiments of the present invention have been shown and described, it would be appreciated by those skilled in the art that changes may be made in this embodiment without departing from the principles and spirit of the invention, the scope of which is defined in the claims and their equivalents.

What is claimed is:

1. A flat panel display device, comprising:

a thin film transistor disposed on a substrate, the thin film transistor comprising:

a semiconductor layer formed in a super grain silicon (SGS) crystallization growth region of a crystalline silicon layer disposed on the substrate and having source and drain regions and a channel region, a gate electrode formed to correspond to a partial region of the semiconductor layer, a gate insulating layer to insulate the semiconductor layer from the gate electrode, and source and drain electrodes electrically connected to the source and drain regions of the semiconductor layer;

a capacitor comprising:

a first capacitor electrode spaced apart from the thin film transistor on the substrate and formed in an SGS crystallization seed region of the crystalline silicon layer disposed on the substrate, a second capacitor electrode formed on the gate insulating layer, and the gate insulating layer to insulate the first capacitor electrode from the second capacitor electrode; and a first electrode of a display electrically connected to one of the source or drain electrodes of the thin film transistor, wherein a grain boundary of the growth region is not disposed in the semiconductor layer.

2. The device of claim 1, wherein the display comprises an organic light emitting diode (OLED) display electrically connected to the thin film transistor, the OLED including the first electrode electrically connected to one of the source or drain electrodes, an organic layer disposed on the first electrode and having an emission layer, and a second electrode disposed on the organic layer.

3. The device of claim 1, wherein a length direction of the channel region of the semiconductor layer is parallel to an SGS crystallization growth direction of the SGS crystallization growth region.

4. The device of claim 1, wherein a seed to promote growth of crystals in the SGS crystallization is formed by a metal catalyst.

5. The device of claim 4, wherein the metal catalyst is one selected from the group consisting of nickel (Ni), palladium (Pd), titanium (Ti), silver (Ag), gold (Au), aluminum (Al), tin (Sn), antimony (Sb), copper (Cu), cobalt (Co), molybdenum (Mo), terbium (Tb), ruthenium (Ru), rhodium (Rh), cadmium (Cd), and platinum (Pt).

6. The device of claim 1, wherein the first capacitor electrode further comprises metal silicide.

7. The device of claim 1, wherein the second capacitor electrode is formed of the same material as the gate electrode or the source and drain electrodes.

8. A flat panel display device, comprising:

a substrate having a first unit pixel region, a second unit pixel region, and an interconnection region disposed therebetween;

thin film transistors comprising:

semiconductor layers disposed on the first and second unit pixel regions of the substrate, and including source, drain, and channel regions formed in super grain silicon (SGS) crystallization growth regions of a crystalline silicon layer disposed on the substrate, gate electrodes formed to correspond to partial regions of the semiconductor layers, a gate insulating layer to insulate the semiconductor layers from the gate electrodes, and source and drain electrodes electrically connected respectively to the source and drain regions of the semiconductor layer;

capacitors comprising:

first capacitor electrodes disposed about the interconnection region on the first and second unit pixel regions, and formed in SGS crystallization seed regions of the crystalline silicon layer disposed on the substrate, the gate insulating layer disposed on the first capacitor electrodes, and second capacitor electrodes disposed on the gate insulating layer; and first electrodes of a display electrically connected to one of the source and drain electrodes of the thin film transistors, respectively, wherein a grain boundary is formed in the interconnection region.

9. The display device of claim 8, wherein the display comprises an organic light emitting diode (OLED) display electrically connected to the thin film transistors, the OLED including the first electrodes electrically and respectively connected to one of the source or drain electrodes of the thin film transistors, organic layers disposed on the first electrodes and each organic layer having an emission layer, and second electrodes disposed on the organic layers.

10. The device of claim 8, wherein a length direction of the channel regions of the semiconductor layer are parallel to an SGS crystallization growth direction of the SGS crystallization growth region.

11. The device of claim 8, wherein a seed to promote growth of crystals in the SGS crystallization is formed by a metal catalyst.

12. The device of claim 11, wherein the metal catalyst is one selected from the group consisting of Ni, Pd, Ti, Ag, Au, Al, Sn, Sb, Cu, Co, Mo, Tb, Ru, Rh, Cd and Pt.

13. The device of claim 8, wherein the first capacitor electrodes further comprise metal silicide.

14. The device of claim 8, wherein the second capacitor electrodes are formed of a same material as the gate electrodes or the source and drain electrodes.

* * * * *